United States Patent [19]
Cohen

[11] Patent Number: 6,136,707
[45] Date of Patent: Oct. 24, 2000

[54] SEED LAYERS FOR INTERCONNECTS AND METHODS FOR FABRICATING SUCH SEED LAYERS

[76] Inventor: Uri Cohen, 765-53 San Antonio Rd., Palo Alto, Calif. 94303

[21] Appl. No.: 09/410,898

[22] Filed: Oct. 2, 1999

[51] Int. Cl.[7] ................... H01L 21/44; H01L 21/4763; H01L 21/31; H01L 21/469
[52] U.S. Cl. ................... 438/687; 438/627; 438/652; 438/763; 438/643
[58] Field of Search ..................... 438/629, 652, 438/687, 643, 644, 763

[56] References Cited

U.S. PATENT DOCUMENTS

| 6,069,068 | 5/2000 | Rathore et al. | 438/628 |
| 6,087,711 | 7/2000 | Givens | 257/661 |

Primary Examiner—Amir Zarabian
Assistant Examiner—Adam Pyonin

[57] ABSTRACT

One embodiment of the present invention is a method for making metallic interconnects including: (a) forming a patterned insulating layer on a substrate, the patterned insulating layer including at least one opening and a field surrounding the at least one opening; (b) depositing a barrier layer over the field and inside surfaces of the at least one opening; (c) depositing a first seed layer over the barrier layer using a first deposition technique; (d) depositing a second seed layer over the first seed layer using a second deposition technique, the first and second deposition techniques being different; and (e) electroplating a metallic layer over the second seed layer, the electroplated metallic layer including a material selected from a group consisting of Cu, Ag, or alloys including one or more of these metals.

38 Claims, 2 Drawing Sheets

SEED LAYERS FOR INTERCONNECTS AND METHODS FOR FABRICATING SUCH SEED LAYERS

TECHNICAL FIELD OF THE INVENTION

The present invention pertains to the field of electroplating metals or alloys for filling high aspect ratio openings, such as trenches and vias, for semiconductor metallization interconnects, thin film heads, or micromachined Microelectromechanical Systems (MEMS) devices. In particular, embodiments of the present invention provide improved seed layers for electroplating copper or silver interconnects in semiconductor devices and methods for fabricating such improved seed layers. The improved seed layers facilitate reliable, void-free filling of small openings with high aspect ratios for so called "Damascene" and "Dual Damascene" copper and/or silver interconnects.

BACKGROUND OF THE INVENTION

As is well known in the prior art, filling trenches and/or vias formed on a wafer by electroplating copper metal to form semiconductor device interconnects (often referred to as a "Damascene" or a "Dual Damascene" process), requires that a metallization layer (often referred to in the art as a seed layer or a base layer) be formed over the wafer surface. As is also well known in the prior art, the seed layer is required: (a) to provide a low-resistance electrical path (to enables uniform electroplating over the wafer surface); (b) to adhere well to the wafer surface (usually to an oxide-containing a dielectric film such as $SiO_2$, $SiO_x$, or $SiO_xN_y$); and (c) to be compatible with subsequent electroplating copper thereon.

As is well known, the requirement of providing a low-resistance electrical path is fulfilled by choosing the seed layer to be comprised of an adequately thick, low-resistivity material.

As is further well known, since copper has a rather poor adhesion to oxide surfaces, the requirement of adhering well to the wafer surface is typically fulfilled by disposing an intermediary barrier (or adhesion) metallic layer having a strong affinity for oxygen atoms under the seed layer. As is well known in the prior art, the barrier metallic layer is formed prior to the seed layer to provide good adhesion: (a) to the oxide surface underneath it (the barrier layer provides good adhesion to the oxide surface by sharing oxygen atoms) and (b) to the seed layer above it (the barrier metallic layer provides good adhesion to the seed layer by metal to metal bonds). The barrier layer is often also referred to as an "adhesion layer" or a "liner". In addition to providing good adhesion, the barrier layer also serves to mitigate copper out-diffusion directly into the device, or indirectly (through an insulating or a dielectric layer) into the device. As is well known in the prior art, the barrier layer is usually chosen from the refractory metals or their alloys, such as for example, Ta, $TaN_x$, Cr, $CrN_x$, Ti, $TiN_x$, W, $WN_x$, and other alloys containing one or more of these materials.

As is still further well known, the requirement of being compatible with electroplating copper is fulfilled by choosing a seed layer that does not react spontaneously (i.e., by displacement) with copper electrolyte used during the electroplating. This is satisfied by requiring that the seed layer does not comprise a metal or alloy that is less noble than copper.

Typically, a seed layer comprises a copper layer that is deposited by a "dry" technique, such as by physical vapor deposition ("PVD"), including but not limited to sputtering or evaporation, or by chemical vapor deposition ("CVD"). However, the seed layer may also be deposited by a "wet" electroless plating process. In such cases, the copper seed layer thickness is typically in a range of about 300 Å to about 2,000 Å on the field (i.e., the top surface of the wafer outside trenches and via openings). In such cases, the barrier layer is typically deposited to a thickness of about 50 Å to about 500 Å (on the field) by either a PVD or a CVD technique.

The PVD techniques include, for example and without limitation, techniques such as evaporation and various sputtering techniques, such as DC and/or RF plasma sputtering, bias sputtering, magnetron sputtering, ion plating, or Ionized Metal Plasma (IMP) sputtering. As is well known in the art, in general, due to their anisotropic and directional ("line of sight") nature, the PVD techniques produce non-conformal deposition. The CVD techniques include, for example and without limitation, thermal CVD, Plasma Enhanced CVD ("PECVD"), Low Pressure CVD ("LPCVD"), High Pressure CVD ("HPCVD"), and Metal Organo CVD ("MOCVD"). For example, one precursor used for CVD Cu is Cupraselect™ which is a precursor of Schumacher, Inc. As is well known in the art, in general, due to their isotropic and non-directional nature, the CVD and the electroless techniques produce conformal deposition, with substantially uniform thickness over the entire surface, including over the field and the bottom and sidewall surfaces of the openings.

Aspect ratio ("AR") is typically defined as a ratio between a vertical dimension, D (depth), of an opening and its smallest lateral dimension, W (width, or diameter): AR=D/W. Usually, in electroplating metals or alloys to fill patterns having high aspect ratio openings (for example, in an insulator or a dielectric), the electroplating rate inside openings is slower than the rate outside openings (i.e., on the field). Further, the higher the AR of the openings, the slower the electroplating rate is inside. This results in poor or incomplete filling (voids) of high AR openings, when compared with results achieved with low AR openings. To overcome this problem in the prior art, commercial copper electrolytes contain additives that adsorb and locally inhibit (or suppress) growth outside the openings (i.e., on the field). Further, growth inhibition inside the openings is decreased from that achieved outside the openings due to slow replenishment of the additives inside the openings as compared with replenishment of the additives on the field. As a result, the deposition rate inside the openings is faster than outside, thereby facilitating void-free copper fill. Other well known reasons for voids in copper electrofill include discontinuous (or incomplete coverage of) seed layers inside the openings, and pinching-off of opening walls (for example, by overhangs of the top corners) prior to plating.

The openings may consist of vias, trenches, or patterned photoresist. As is well known, in damascene or dual damascene processes, an insulating or a dielectric layer is pattern-etched to form openings therein. Next, a barrier (or an adhesion) metallic layer and a seed layer are deposited over the insulating layer to metallize its field (the surface surrounding openings), as well as the sidewalls and bottom surfaces of the openings. Next, copper electroplating is performed over the entire metallized surface, including the top surface (the field) surrounding the openings, and inside the patterned openings. Finally, excess plated copper overlying the openings and the top surface (the field) of the insulating layer, as well as the barrier and seed layers on the field, are removed, for example, by a mechanical polishing or by a chemical mechanical polishing ("CMP") technique. The end result is copper filled openings (trenches and vias), including bottom and sidewall surfaces lined by the barrier and seed layers. In today's most advanced copper filling processes for trenches and vias, the openings have ARs as high as 5:1 (D=1.25 µm; W=0.25 µm). Future trenches and vias openings will likely require W=0.13–0.18 µm, or narrower, and AR=6:1–10:1, or larger.

As semiconductor device dimensions continue to shrink, there is an ever increasing demand for narrower interconnect cross-sections and, thus, smaller openings and larger aspect ratios (AR) during the copper electrofill. To ensure void-free copper filling, the seed layer inside the openings must completely cover the bottom and the sidewall surfaces inside the openings without discontinuities, or else there will be voids in the copper electrofill. On the other hand, the seed layer must not be so thick on the sidewalls that it pinches-off the very narrow openings and should not overhang the top corners of the openings so that it pinches-off the very small openings. Similarly, the barrier layer must also be continuous inside the openings. In contrast to these requirements with respect to the openings, the seed layer must be sufficiently thick on the top surface (the field) to provide a low-resistive electrical path that facilitates uniform plating across the surface of the wafer. That is, the seed layer must be sufficiently thick on the field to avoid radial non-uniformity across the wafer caused by a voltage (or IR) drop between a contact at the edge of the wafer to the center of the wafer. Any voltage drop (and resulting non-uniformity therefrom) becomes more severe as the resistance of the seed layer increases due to high resistivity and/or insufficient thickness. To ensure a sufficiently low-resistance seed layer, it is now common to deposit a copper seed layer to a thickness of about 1,000 Å to about 2,000 Å on the top surface (field) by a PVD technique, or to a thickness of about 300 Å to about 1,000 Å by a CVD technique.

However, neither of these techniques satisfies all of the above-identified requirements. The non-conformal PVD techniques, while providing adequate thickness on the field, fail to provide continuous and complete step coverage inside very narrow openings with large AR. They also result in substantial overhangs at the top corners of the openings. The conformal CVD or electroless techniques, on the other hand, while providing continuous and complete step coverage of the seed layer inside very narrow openings, pinch-off the small openings when used at thicknesses required on the field for a low-resistance electrical path. As a result, typical conformal CVD or electroless seed layers are too thin on the field and too thick inside the very narrow openings.

As one can readily appreciate from the above, a need exists in the art for a method for void-free copper filling of very narrow openings having high aspect ratios.

SUMMARY OF THE INVENTION

Embodiments of the present invention advantageously satisfy the above-identified need in the art and provide a method for void-free copper or silver filling of small openings having high aspect ratios.

One embodiment of the present invention is a method for making metallic interconnects comprising: (a) forming a patterned insulating layer on a substrate, the patterned insulating layer including at least one opening and a field surrounding the at least one opening; (b) depositing a barrier layer over the field and inside surfaces of the at least one opening; (c) depositing a first seed layer over the barrier layer using a first deposition technique; (d) depositing a second seed layer over the first seed layer using a second deposition technique, the first and second deposition techniques being different; and (e) electroplating a metallic layer over the second seed layer, the electroplated metallic layer comprising a material selected from a group consisting of Cu, Ag, or alloys comprising one or more of these metals.

DETAILED DESCRIPTION

Figure 1:
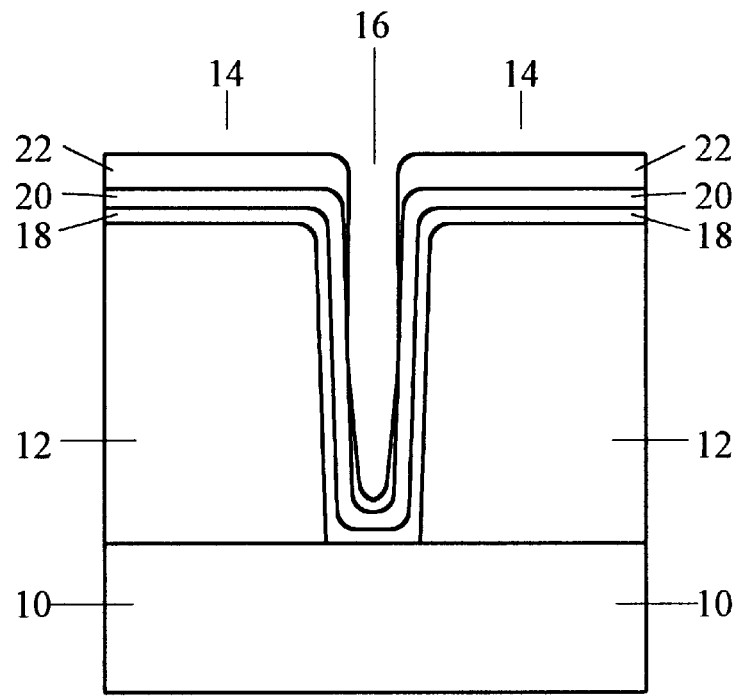
FIG. 1 shows a cross-sectional view of an inventive structure formed in accordance with a preferred embodiment of the present invention wherein a first, conformal seed layer is deposited over a barrier layer, followed by a second, non-conformal seed layer deposited over the first, conformal seed layer.

FIG. 1 shows a cross-sectional view of an inventive structure formed in accordance with a preferred embodiment of the present invention wherein a first, conformal seed layer is deposited over a barrier layer, followed by a second, non-conformal seed layer deposited over the first, conformal seed layer. The conformal seed layer provides continuous and complete step coverage inside the openings, while the non-conformal seed layer provides a low resistance electrical path over the top surface (field) surrounding the openings to enable uniform plating across the substrate (or wafer).

In accordance with the preferred embodiment of the inventive method of the present invention, barrier layer 18 is deposited over the entire surface of wafer 10, including over patterned insulating layer 12 (having had opening 16 patterned therein in accordance with any one of a number of methods that are well known to those of ordinary skill in the art), using a conformal Chemical Vapor Deposition ("CVD") technique. Although the term barrier layer is used, it should be understood by those of ordinary skill in the art that the term barrier layer includes examples wherein: (a) the barrier layer acts both as an adhesion layer and as a barrier layer; (b) a barrier layer separate from an adhesion layer is used; and (c) a multiplicity of layers is used, some acting as adhesion layers, some acting as barrier layers, or some acting as both. Further, although the term wafer is used, this also includes the term substrate as it is used in the art. Still further, although the present invention is described in the context of opening 16, in practice, a multiplicity of openings are patterned and filled in accordance with the present invention.

Advantageously, in accordance with the present invention, the use of a CVD technique to deposit barrier layer 18 ensures substantially complete and continuous coverage of the bottom and sidewall surfaces inside opening 16. However, it is within the scope of the present invention that barrier layer 18 may also be deposited using a Physical Vapor Deposition ("PVD") technique that provides continuous bottom and sidewall coverage. In accordance with the present invention, barrier layer 18 may comprise, for example and without limitation, a material selected from Ta, $TaN_x$, Cr, $CrN_x$, Ti, $TiN_x$, W, $WN_x$, and other alloys containing one or more of these materials. Further, the thickness of barrier layer 18 can be in a range of about 30 Å to about 500 Å, and more preferably in a range of about 50 Å to about 300 Å. Since barrier layer 18 occupies a certain fraction of interconnects formed in accordance with the present invention, and since barrier layer 18 has a relatively large resistivity, its thickness should be minimized. However, the thickness of barrier layer 18 should be sufficiently large to mitigate copper out-diffusion and to provide complete bottom and sidewall coverage inside opening 16. Many CVD techniques and PVD techniques are well known to those of ordinary skill in the art for forming barrier layer 18.

Next, conformal seed layer 20 is deposited over barrier layer 18. Conformal seed layer 20 can be preferably deposited by using a CVD technique, but it can also be deposited by using an electroless technique. Many CVD techniques and electroless techniques are well known to those of ordinary skill in the art for forming conformal seed layer 20. The thickness of conformal seed layer 20 can be in a range of about 50 Å to about 500 Å, and more preferably in a range of about 100 Å to about 300 Å. Finally, non-conformal seed layer 22 is deposited over conformal seed layer 20. Non-conformal seed layer 22 can be preferably obtained using a PVD technique. Many PVD techniques are well known to those of ordinary skill in the art for forming non-conformal seed layer 22. The thickness of non-conformal seed layer 22 can be in a range of about 100 Å to about 2,000 Å, and more preferably in a range of about 300 Å to about 1,000 Å (in the field).

In accordance with the present invention, the conformal and non-conformal seed layers may comprise the same material, or they may comprise different materials. Although copper is commonly used as a seed layer, a highly conductive silver (Ag) layer can also be used. In fact, Ag has lower resistivity than that of Cu and, therefore, can be formed with a smaller thickness than that required when using Cu. Thus, conformal seed layer 20 and non-conformal seed layer 22 may comprise, for example, a material selected from Cu, Ag, or alloys comprising one or more of these metals.

Due to the non-directional, isotropic nature of CVD deposition techniques, the thickness of the CVD layers is substantially uniform over the entire surface (i.e., conformal), including over field 14, and over bottom and sidewall surfaces inside opening 16. In reality, however, even the best conformal CVD layers are thicker over the field than inside the openings. In fact, it is quite common for CVD Cu seed layers inside openings to have a thickness of about 80% of that over the field. In addition, the thickness of a CVD barrier layer inside the openings is typically only about 50% of that over the field. Thus, even the best CVD layers exhibit some overhang at the top corners of the openings.

The following presents an example of a preferred embodiment of the inventive method for 0.18 µm wide vias or trenches. In accordance with the preferred embodiment, one deposits, by a CVD technique, a barrier layer comprised of about 200 Å of TaN or WN, then one deposits, by a CVD technique, a conformal seed layer comprised of about 300 Å of Cu, finally one deposits, by a PVD technique, a non-conformal seed layer comprised of about 600 Å of Cu (as measured on the field). This will result in a total combined thickness of about 400 Å inside the openings: {Cu(PVD~50 Å)/Cu(CVD~250 Å)/TaN(CVD~100 Å)} and a combined Cu seed layer thickness of about 900 Å on the field: {Cu(PVD~600 Å)/Cu(CVD~300 Å)/TaN(CVD~200 Å)}. Advantageously, in accordance with the present invention, the inventive "two-step" seed layer deposition ensures a continuous seed layer having excellent step coverage, and a low-resistance electrical path on the field to ensure uniform copper plating across the wafer. It may be noted that although the combined thickness of the copper seed layers inside the openings is only about 300 Å, due to the very short distance to the field (typically about 1 µm), a voltage drop from the field to the inside of the openings is negligible. Thus, the thickness of the "two-step" seed layer inside the openings is adequate for copper plating therein. In fact, if necessary, the thickness of the "two-step" seed layer inside the openings can be further decreased (to a range from about 100 Å to about 200 Å) to enable void-free copper filling of even smaller openings (for example, 0.13 µm). In the above example, the combined thicknesses of the barrier and seed layers at the sidewalls of the openings is about 400 Å on each side, thus occupying about 800 Å of the 1,800 Å opening. This leaves enough room (~1,000 Å) to facilitate electroplating inside the opening without sealing or pinching-off of the top corners.

After depositing seed layers 20 and 22 shown in FIG. 1, substrate 10 is placed in a copper electroplating bath, and electroplating is carried out in accordance with any one of a number of methods that are well known to those of ordinary skill in the art to deposit a thickness of copper sufficient to fill patterned opening 16, with some excess, and to cover field 14 surrounding opening 16. Finally, excess plated copper overlying opening 16 and overlying field 14, as well as seed layers 20 and 22 and barrier layer 18 overlying field 14, are removed using any one of a number of techniques that are well known to those of ordinary skill in the art, for example, using a mechanical polishing or a chemical mechanical polishing (CMP) technique. Other removal techniques, such as wet or dry etching techniques may also be used to remove excess plated copper overlying opening 16 and field 14, and to remove seed layers 20 and 22 and barrier metallic layer 18 overlying field 14. It should be clear to those of ordinary skill in the art that removal may also be accomplished using a combination of techniques, including those identified above.

Although the detailed description above refers to filling opening 16 by electroplating copper, it is within the scope of the present invention to electrofill opening 16 with any low resistivity material, such as a material selected from Cu, Ag, or an alloy comprising one or more of these metals. In fact, silver (Ag) has lower resistivity than that of Cu, and may be attractive for further reducing the dimensions of the interconnects.

Figure 2:
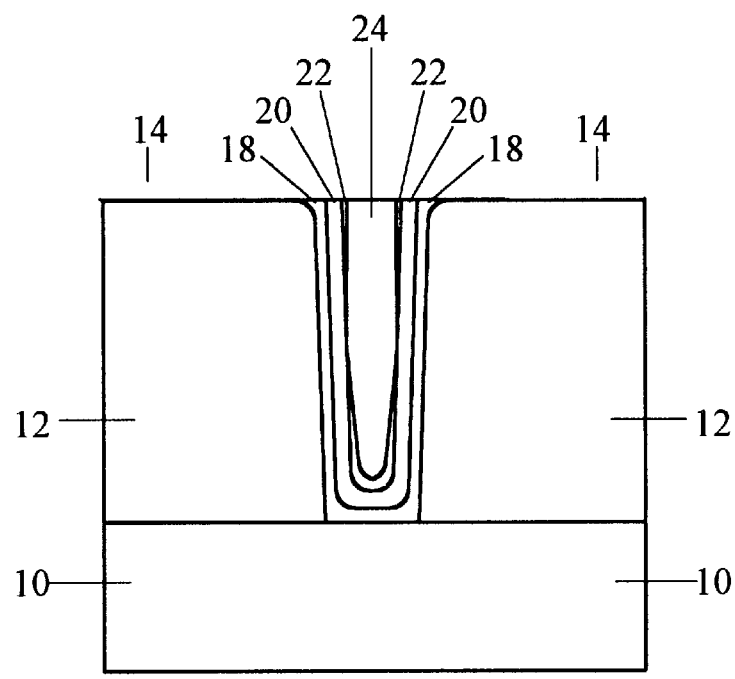
FIG. 2 shows a cross-sectional view of the inventive structure of FIG. 1 after removing excess plated copper or silver overlying an opening and the field, as well as removing the seed layers and barrier layer overlying the field surrounding the opening.

FIG. 2 shows a cross-sectional view of the inventive structure of FIG. 1 after removing excess plated copper (or silver) 24 overlying opening 16 and field 14, and removing seed layers 20 and 22 and barrier layer 18 overlying field 14 surrounding opening 16. FIG. 2 illustrates the filling of openings (trenches and vias) with electroplated copper (or silver) 24, as well as the lining of the bottom and sidewall surfaces of opening 16 by barrier layer 18 and seed layers 20 and 22. As shown in FIG. 2, all metallic layers were removed from field 14 of insulating layer 12 which surrounds embedded electroplated copper (or silver) interconnect 24.

Figure 3:
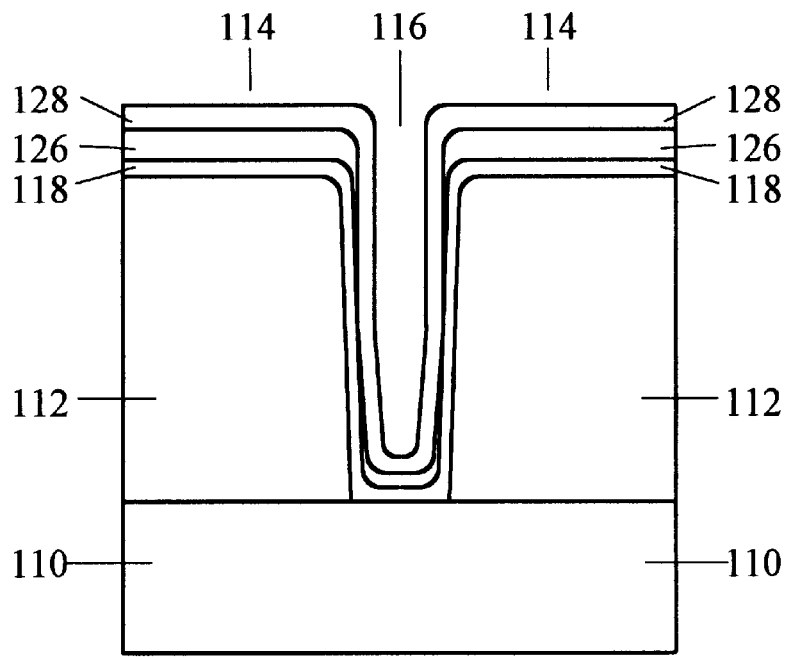
FIG. 3 shows a cross-sectional view of an inventive structure formed in accordance with an alternative embodiment of the present invention wherein a first, non-conformal seed layer is deposited over a barrier layer, followed by a second, conformal seed layer deposited over the first, non-conformal seed layer.

FIG. 3 shows a cross-sectional view of an inventive structure formed in accordance with an alternative embodiment of the present invention wherein a first, non-conformal seed layer is deposited over a barrier layer, followed by a second, conformal seed layer deposited over the first, non-conformal seed layer. The non-conformal seed layer provides a low resistance electrical path over the top surface (field) surrounding the openings to enable uniform plating across the substrate (or wafer), while the conformal seed layer provides continuous and complete step coverage inside the openings.

In accordance with the alternative embodiment of the inventive method of the present invention, barrier layer 118 is deposited over the entire surface of wafer 110, including over patterned insulating layer 112 (having had opening 116 patterned therein in accordance with any one of a number of methods that are well known to those of ordinary skill in the art), using a conformal Chemical Vapor Deposition ("CVD") technique. Although the term barrier layer is used herein, it should be understood by those of ordinary skill in the art that the term barrier layer includes examples wherein: (a) the barrier layer acts both as an adhesion layer and as a barrier layer; (b) a barrier layer separate from an adhesion layer is used; and (c) a multiplicity of layers is used, some acting as adhesion layers, some acting as barrier layers, or some acting as both. Further, although the term wafer is used, this also includes the term substrate as it is used in the art. Still further, although the present invention is described in the context of opening 116, in practice, a multiplicity of openings are patterned and filled in accordance with the present invention.

Advantageously, in accordance with the present invention, the use of a CVD technique to deposit barrier layer 118 ensures complete and continuous coverage of the bottom and sidewall surfaces inside opening 116. However, it is within the scope of the present invention that barrier layer 118 may also be deposited using a Physical Vapor Deposition ("PVD") technique that provides continuous bottom and sidewall coverage. In accordance with the present invention, barrier layer 118 may comprise, for example and without limitation, a material selected from Ta, $TaN_x$, Cr, $CrN_x$, Ti, $TiN_x$, W, $WN_x$, and other alloys containing one or more of these materials. Further, the thickness of barrier layer 118 can be in a range of about 30 Å to about 500 Å, and more preferably in a range of about 50 Å to about 300 Å. Since barrier layer 118 occupies a certain fraction of interconnects formed in accordance with the present invention, and since barrier layer 118 has a relatively large resistivity, its thickness should be minimized. However, the thickness of barrier layer 118 should be sufficiently large to mitigate copper out-diffusion and to provide complete bottom and sidewall coverage inside opening 116. Many CVD techniques and PVD techniques are well known to those of ordinary skill in the art for forming barrier layer 118.

Next, non-conformal seed layer 126 is deposited over barrier layer 118. Non-conformal seed layer 126 can be preferably obtained using a PVD technique. Many PVD techniques are well known to those of ordinary skill in the art for forming non-conformal seed layer 126. The thickness of non-conformal seed layer 126 can be in a range of about 100 Å to about 2,000 Å, and more preferably in a range of about 300 Å to about 1,000 Å (on the field). Finally, conformal seed layer 128 is deposited over non-conformal seed layer 126. Conformal seed layer 128 can be preferably obtained using a CVD or electroless technique. Many CVD techniques and electroless techniques are well known to those of ordinary skill in the art for forming conformal seed layer 128. The thickness of conformal seed layer 128 can be in a range of about 50 Å to about 500 Å, and more preferably in a range of about 100 Å to about 300 Å.

In accordance with the present invention, the conformal and non-conformal seed layers may comprise the same material, or they may comprise different materials. Although copper is commonly used as a seed layer, a highly conductive silver (Ag) layer can also be used. Non-conformal seed layer 126 and conformal seed layer 128 may comprise, for example, a material selected from Cu, Ag, or alloys comprising one or more of these metals.

After depositing seed layers 126 and 128 shown in FIG. 3, substrate 110 is placed in a copper electroplating bath, and electroplating is carried out in accordance with any one of a number of methods that are well known to those of ordinary skill in the art to deposit a thickness of copper sufficient to fill patterned opening 116, with some excess, and to cover field 114 surrounding opening 116. Finally, excess plated copper overlying opening 116 and field 114 of insulating layer 112, as well as seed layers 126 and 128 and barrier layer 118 overlying field 114, are removed using any one of a number of techniques that are well known to those of ordinary skill in the art, for example, using a mechanical polishing or a chemical mechanical polishing (CMP) technique. Other removal techniques, such as wet or dry etching techniques may also be used to remove excess plated copper overlying opening 116 and field 114, and to remove seed layers 126 and 128 and barrier layer 118 overlying field 114. It should be clear to those of ordinary skill in the art that removal may also be accomplished using a combination of techniques, including those identified above.

Although the detailed description above refers to filling opening 116 by electroplating copper, it is within the scope of this invention to electrofill opening 116 with any low resistivity material, such as a material selected from Cu, Ag, or alloys comprising one or more of these metals. In fact, silver (Ag) has lower resistivity than that of Cu, and may be attractive for further reducing the dimensions of the interconnects.

Figure 4:
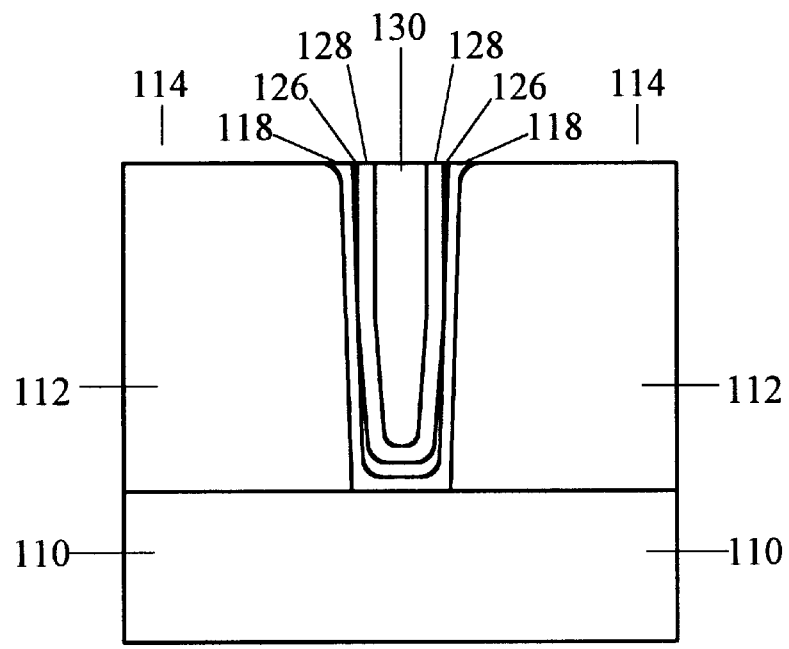
FIG. 4 shows a cross-sectional view of the inventive structure of FIG. 3 after removing excess plated copper or silver overlying an opening and the field, as well as removing the seed layers and barrier layer overlying the field surrounding the opening.

FIG. 4 shows a cross-sectional view of the inventive structure of FIG. 3 after removing excess electroplated copper (or silver) 130 overlying opening 116 and field 114, and removing seed layers 126 and 128 and barrier layer 118 overlying field 114 surrounding opening 116. FIG. 4 illustrates the filling of openings (trenches and vias) with electroplated copper (or silver) 130, as well as the lining of the bottom and sidewall surfaces of opening 116 by barrier layer 118 and seed layers 126 and 128. As shown in FIG. 4, all metallic layers were removed from field 114 of insulating layer 112 which surrounds embedded electroplated copper (or silver) interconnect 130.

It should be understood that the scope of the present invention is not limited to the embodiments described above with respect to FIG. 1 and FIG. 3. For example, in accordance with further embodiments of the present invention, a thin ("Flash") PVD seed layer can be deposited first, followed by a conformal CVD or electroless seed layer, and finally followed by a (relatively thick) PVD seed layer to produce three separately deposited seed layers. Another three-step combination may include a first deposited CVD seed layer, followed by a relatively thick PVD seed layer, and finally followed by a second deposited CVD seed layer. Other combinations may comprise even more steps in the deposition of the seed layer. In accordance with one aspect of the present invention, the first PVD Flash seed layer may serve to enhance adhesion to the barrier layer and/or to improve grain morphology of a subsequently deposited CVD seed layer. In this embodiment, the three (or more) separately deposited seed layers may comprise the same metal or alloy or they may comprise, for example and without limitation, different materials chosen from Cu, Ag, or alloys comprising one or more of these metals.

Those skilled in the art will recognize that the foregoing description has been presented for the sake of illustration and description only. As such, it is not intended to be exhaustive or to limit the invention to the precise form disclosed.

What is claimed is:

1. A method for making metallic interconnects comprising:
   forming a patterned insulating layer on a substrate, the patterned insulating layer including at least one opening and a field surrounding the at least one opening;
   depositing a barrier layer over the field and inside surfaces of the at least one opening;
   depositing a first seed layer over the barrier layer using a first deposition technique;
   depositing a second seed layer over the first seed layer using a second deposition technique, the first and second deposition techniques being different; and
   electroplating a metallic layer over the second seed layer, the electroplated metallic layer comprising a material selected from a group consisting of Cu, Ag, or alloys comprising one or more of these metals.

2. The method of claim 1 wherein the electroplated metallic layer comprises Cu.

3. The method of claim 1 wherein the electroplated metallic layer comprises Ag.

4. The method of claim 2 further comprising:
   substantially removing electroplated copper overlying the opening and overlying the field, and removing the seed layers and the barrier layer overlying the field, wherein the removing comprises one or more of a mechanical polishing technique, a chemical mechanical polishing technique, a wet etching technique, and a dry etching technique.

5. The method of claim 1 wherein the first and second seed layers comprise a material selected from a group consisting of Cu, Ag, or alloys comprising one or more of these metals.

6. The method of claim 1 wherein the first and second seed layers comprise Cu.

7. The method of claim 1 wherein the barrier layer is selected from a group consisting of Ta, $TaN_X$, Cr, $CrN_X$, Ti, $TiN_X$, W, $WN_X$, or alloys comprising one or more of these materials.

8. The method of claim 1 wherein the barrier layer is deposited by a chemical vapor deposition technique.

9. The method of claim 1 wherein the barrier layer is deposited by a physical vapor deposition technique.

10. The method of claim 1 wherein the barrier layer has a thickness in a range of about 30 Å to about 500 Å.

11. The method of claim 1 wherein the barrier layer has a thickness in a range of about 50 Å to about 300 Å.

12. The method of claim 1 wherein the first deposition technique comprises a conformal deposition technique and the second deposition technique comprises a non-conformal deposition technique.

13. The method of claim 12 wherein:
    the conformal deposition technique comprises a chemical vapor deposition (CVD) technique or an electroless technique; and
    the non-conformal deposition technique comprises a physical vapor deposition (PVD) technique.

14. The method of claim 12 wherein the conformal deposition technique is a chemical vapor deposition (CVD) technique.

15. The method of claim 12 wherein the first seed layer and the second seed layer comprise a material selected from a group consisting of Cu, Ag, or alloys comprising one or more of these metals.

16. The method of claim 12 wherein the first and second seed layers comprise Cu.

17. The method of claim 12 wherein the first seed layer has a thickness in a range of about 50 Å to about 500 Å over the field and the second seed layer has a thickness in a range of about 100 Å to about 2,000 Å over the field.

18. The method of claim 12 wherein the first seed layer has a thickness in a range of about 100 Å to about 300 Å over the field and the second seed layer has a thickness in a range of about 300 Å to about 1,000 Å over the field.

19. The method of claim 12 further comprising depositing at least one additional seed layer over the second seed layer prior to electroplating.

20. The method of claim 19 wherein depositing at least one additional seed layer comprises using a conformal deposition technique.

21. The method of claim 20 wherein the first deposition technique comprises a chemical vapor deposition technique, the second deposition technique comprises a physical vapor deposition technique, and depositing at least one additional seed layer comprises using a chemical vapor deposition technique.

22. The method of claim 12 further comprising depositing at least one additional seed layer under the first seed layer.

23. The method of claim 22 wherein depositing at least one additional seed layer comprises using a non-conformal deposition technique.

24. The method of claim 23 wherein depositing at least one additional seed layer comprises using a physical vapor deposition technique.

25. The method of claim 1 wherein the first deposition technique comprises a non-conformal deposition technique and the second deposition technique comprises a conformal deposition technique.

26. The method of claim 25 wherein:
    the non-conformal deposition technique comprises a physical vapor deposition (PVD) technique; and
    the conformal deposition technique comprises a chemical vapor deposition (CVD) technique, or an electroless technique.

27. The method of claim 25 wherein the conformal deposition technique is a chemical vapor deposition (CVD) technique.

28. The method of claim 25 wherein the first seed layer and the second seed layer comprise a material selected from a group consisting of Cu, Ag, or alloys comprising one or more of these metals.

29. The method of claim 25 wherein the first and second seed layers comprise Cu.

30. The method of claim 25 wherein the first seed layer has a thickness in a range of about 100 Å to about 2,000 Å over the field and the second seed layer has a thickness in a range of about 50 Å to about 500 Å over the field.

31. The method of claim 25 wherein the first seed layer has a thickness in a range of about 300 Å to about 1,000 Å over the field and the second seed layer has a thickness in a range of about 100 Å to about 300 Å over the field.

32. The method of claim 25 further comprising depositing at least one additional seed layer over the second seed layer prior to electroplating.

33. The method of claim 32 wherein depositing at least one additional seed layer comprises using a non-conformal deposition technique.

34. The method of claim 33 wherein the first deposition technique comprises a physical vapor deposition technique, the second deposition technique comprises a chemical vapor deposition technique, and depositing at least one additional seed layer comprises using a physical vapor deposition technique.

35. A method for making copper interconnects comprising:

forming a patterned insulating layer on a substrate, the patterned insulating layer including at least one opening and a field surrounding the at least one opening;

depositing a barrier layer over the patterned insulating layer including overlying the field and inside surfaces of the at least one opening, the barrier layer comprising a refractory metal or an alloy comprising a refractory metal;

chemical vapor depositing a first copper seed layer over the barrier layer, the first copper seed layer substantially continuously covering inside surfaces of the at least one opening;

physical vapor depositing a second copper seed layer over the first copper seed layer; and electroplating copper over the second seed layer.

36. A method for making copper interconnects comprising:

forming a patterned insulating layer over a substrate, the patterned insulating layer including at least one opening and a field surrounding the at least one opening;

depositing a barrier layer over the patterned insulating layer including overlying the field and inside surfaces of the at least one opening, the barrier layer comprising a refractory metal or an alloy comprising a refractory metal;

physical vapor depositing a first copper seed layer over the barrier layer;

chemical vapor depositing a second copper seed layer over the first copper seed layer; and electroplating copper over the second seed layer.

37. A method for making metallic interconnects comprising:

forming a patterned insulating layer on a substrate, the patterned insulating layer including at least one opening and a field surrounding the at least one opening;

depositing a barrier layer over the field and inside surfaces of the at least one opening;

depositing two or more seed layers over the barrier layer using two or more different deposition techniques; and electroplating a metallic layer over the two or more seed layers, the electroplated metallic layer comprising a material selected from a group consisting of Cu, Ag, or alloys comprising one or more of these metals.

38. Copper filled via or trench interconnects on a substrate comprising:

a patterned insulating layer formed on the substrate, the patterned insulating layer including at least one opening;

a barrier layer formed over the patterned insulating layer, including inside surfaces of the at least one opening;

a first seed layer deposited over the barrier layer, including inside surfaces of the at least one opening;

a second seed layer deposited over the first seed layer; and an electroplated metallic layer deposited over the second deposited seed layer, said metallic layer comprising a material selected from a group consisting of Cu, Ag, or alloys comprising one or more of these metals.

* * * * *

(12) EX PARTE REEXAMINATION CERTIFICATE (8943rd)
United States Patent
Cohen

(10) Number: US 6,136,707 C1
(45) Certificate Issued: Apr. 3, 2012

(54) SEED LAYERS FOR INTERCONNECTS AND METHODS FOR FABRICATING SUCH SEED LAYERS

(76) Inventor: Uri Cohen, Palo Alto, CA (US)

Reexamination Request:
No. 90/008,846, Oct. 12, 2007

Reexamination Certificate for:
Patent No.: 6,136,707
Issued: Oct. 24, 2000
Appl. No.: 09/410,898
Filed: Oct. 2, 1999

(51) Int. Cl.
*H01L 21/768* (2006.01)
*H01L 21/70* (2006.01)

(52) U.S. Cl. ............... 438/687; 438/627; 438/643; 438/652; 438/763

(58) Field of Classification Search ............ None
See application file for complete search history.

(56) References Cited

To view the complete listing of prior art documents cited during the proceeding for Reexamination Control Number 90/008,846, please refer to the USPTO's public Patent Application Information Retrieval (PAIR) system under the Display References tab.

*Primary Examiner* — Alan Diamond

(57) ABSTRACT

One embodiment of the present invention is a method for making metallic interconnects including: (a) forming a patterned insulating layer on a substrate, the patterned insulating layer including at least one opening and a field surrounding the at least one opening; (b) depositing a barrier layer over the field and inside surfaces of the at least one opening; (c) depositing a first seed layer over the barrier layer using a first deposition technique; (d) depositing a second seed layer over the first seed layer using a second deposition technique, the first and second deposition techniques being different; and (e) electroplating a metallic layer over the second seed layer, the electroplated metallic layer including a material selected from a group consisting of Cu, Ag, or alloys including one or more of these metals.

At the time of issuance and publication of this certificate, the patent remains subject to pending reissue application numbers 13/294,418 filed Nov. 11, 2011. The claim content of the patent may be subsequently revised if a reissue patent is issued from the reissue application.

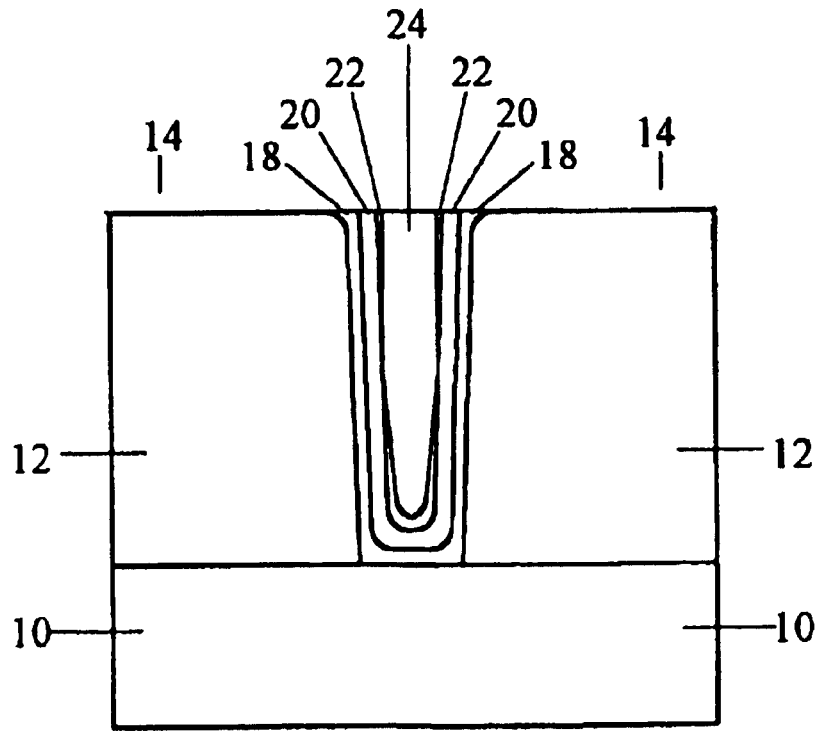

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-38 are cancelled.

* * * * *